(12) United States Patent  (10) Patent No.: US 7,190,603 B2
Ogura et al.  (45) Date of Patent: Mar. 13, 2007

(54) NONVOLATILE MEMORY ARRAY ORGANIZATION AND USAGE

(75) Inventors: Seiki Ogura, Hillsboro, OR (US); Tomoko Ogura, Hillsboro, OR (US); Ki-Tae Park, Hwaseong (KR); Nori Ogura, Hillsboro, OR (US); Kimihiro Satoh, Portland, OR (US); Tomoya Saito, Beaverton, OR (US)

(73) Assignee: Halo LSI, Inc., Hillsboro, OR (US)

( * ) Notice: Subject to any disclaimer, the term of this patent is extended or adjusted under 35 U.S.C. 154(b) by 20 days.

(21) Appl. No.: 11/124,221

(22) Filed: May 6, 2005

(65) Prior Publication Data

US 2005/0248984 A1  Nov. 10, 2005

Related U.S. Application Data

(60) Provisional application No. 60/569,388, filed on Jun. 7, 2004.

(51) Int. Cl.
 *G11C 5/06* (2006.01)
(52) U.S. Cl. .............. 365/63; 365/185.13; 365/185.11; 365/230.03
(58) Field of Classification Search .................. 365/63, 365/185.13, 185.11, 230.03
See application file for complete search history.

(56) References Cited

U.S. PATENT DOCUMENTS 5,627,784 A * 5/1997 Roohparvar ........... 365/189.01
6,172,918 B1 1/2001 Hidaka
6,222,768 B1 * 4/2001 Hollmer et al. ........ 365/185.16
6,255,166 B1 7/2001 Ogura et al. ................. 438/257
6,643,172 B2 11/2003 Ogura .................... 365/185.03
6,707,720 B2 3/2004 Kamei et al. .......... 365/185.33
6,707,742 B2 3/2004 Kamei et al. ................ 365/210
6,710,399 B2 3/2004 Kamei ......................... 257/319
6,759,290 B2 7/2004 Ogura et al. ................. 438/200
6,768,699 B2 7/2004 Dosaka
6,804,164 B2 10/2004 Fujino et al.
6,834,323 B2 * 12/2004 Dover et al. ........... 365/185.03

* cited by examiner

*Primary Examiner*—Tuan T. Nguyen
(74) *Attorney, Agent, or Firm*—Saile Ackerman LLC; Stephen B. Ackerman; Rosemary L. S. Pike

(57) ABSTRACT

A non-volatile semiconductor storage device array organization for wide program operations is achieved. The device includes a memory cell array region in which a plurality of C columns and R rows of memory cells comprise one UNIT, arranged in a "diffusion bit" array organization which is comprised of R rows of word lines running in a first direction, and C columns of diffusion sub bit lines running in a second direction, and C columns of sub control gate lines running in the same second direction and a sense amplifier/page buffer area shared by several UNIT's through a bit decode circuit, wherein the diffusion sub bit lines in each of the UNIT's are connected to main bit lines which are in turn connected to the sense amplifier/page buffer area, wherein the bit decode circuit selects one diffusion sub bit line column of memory cells in every E columns.

20 Claims, 11 Drawing Sheets

NONVOLATILE MEMORY ARRAY ORGANIZATION AND USAGE

This application claims priority to U.S. Provisional Patent Application Ser. No. 60/569,388, filed on May 7, 2004, which is herein incorporated by reference in its entirety.

BACKGROUND OF THE INVENTION

1. Field of the Invention

The present invention relates to semiconductor memory and in particular to the array organization for wide program operations and usage of non-volatile memory.

2. Description of the Related Art

Flash memory is characterized by having asymmetric program and erase units. Erase units, called ERASE BLOCKS, are typically large, on the order of 0.5 Mb or 1 Mb or higher. Program units are usually smaller and depend on the application demands. In NOR-type applications, only 16–32b are programmed at once. This data width historically has been limited by the high cell currents associated with the Channel Hot Electron (CHE) injection program method.

Faster program by wide program data width is preferred for mass storage applications. Program units in NAND memories are significantly larger than in NOR memories, typically about 16 kb. NAND memories use Fowler-Nordheim (F-N) tunneling, which is slower, but requires lower current. Therefore, more cells can be programmed in parallel.

Organization of memory arrays is highly dependent upon the application requirements for program and erase data sizes and upon the physical method by which the memory cells program and erase.

Prior Art—NAND Memory Organization: A cross-section of a typical floating gate memory cell 101 is given in FIG. 1. Charge is stored in the floating gate 80 under the word gate 90. The cell is programmed and erased by F-N tunneling. An example of voltage conditions for program and erase will be given. For program, word gate 90 is raised to about 20V, and the bit diffusions 20 and 21 are biased to 0V. In order to erase, the bit diffusions 20 and 21 may be kept at approximately 0V while the word gate is lowered to −20V.

The NAND array provides maximum array efficiency, as shown in FIG. 2. The memory cell is arranged in series, and the word gates are shared in rows, as word lines (WL). The number of rows R between select transistors 70 and 71 is limited by voltage drop through the column. Conventional NAND memories have 16 or 32 rows. The number of columns C is equivalent to the Page size, usually 16 Kb.

Due to the high WL voltage applied during program, WL program disturb is high. Therefore, all of the cells on a single WL are programmed together in one operation. During erase, all the word lines in a section are selected together and the erase block size is R×C.

In summary, the main characteristic of the NAND organization is that all of the cells on the single WL belong to the same erase block.

Prior Art—Twin MONOS: In contrast to the NAND cell operation, the Twin MONOS cell, which was introduced in U.S. Pat. No. 6,255,166 to Ogura et al (assigned to the same assignee as the present invention and herein incorporated in its entirety), uses its unique second control gate (CG) in order to modulate erase selection. A cross-section of the Twin MONOS cell is shown in FIG. 3. This double density cell has two memory storage regions in a single cell. Word gates 901 and 902 are formed by normal lithography. Control gates 11, 12, 13, and 14 are formed by sidewall polysilicon. Neighboring sidewalls 12 and 13 are electrically connected together. Charge is stored in two separate trap regions 602 and 603 under the 2 separate control gates 12 and 13, respectively.

The memory organization of a diffusion bit array was also disclosed in U.S. Pat. No. 6,255,166. In this memory arrangement, the CG lines run in parallel with the Bit Lines (BL) and orthogonal to the Word Lines. There are no contacts for BL in the high density memory array region itself. FIG. 4 gives a schematic representation of the diffusion bit array. Although CG contacts are taken on the opposite side of the memory array from the BL labels in this figure, the actual layout implementation can vary, depending on the layout design rule constraints. In very high density arrays, it is most likely that CG contacts will alternate even/odd on both sides of the memory array. BL contacts will also most likely alternate in the same even/odd or odd/even manner, depending on how the stitch process is designed. U.S. Pat. No. 6,759,290 to Ogura et al, assigned to the same assignee as the present invention and herein incorporated by reference in its entirety, is directed towards some examples of stitch and select implementations in a twin MONOS memory array.

In the Twin MONOS cell, erase can be performed by hot hole injection and F-N tunneling, but hot hole injection is preferred because of the lower voltage requirement and faster operation time.

Several Twin MONOS memory cells may be selected in parallel in the same way as for conventional memories. A decode area may select one column in 4 columns, or 8, 16, or 32 memory columns and connect the selected column to a single sense amplifier or page buffer. In addition to the conventional column decode methods, the Twin MONOS cell's dual-bit characteristic gives a further unique option for memory selection. When a single memory column is selected, there are two additional ways that the Twin MONOS cells may be selected. These methods have already been described in U.S. Pat. No. 6,643,172 to Ogura, assigned to the same assignee as the present invention and herein incorporated by reference in its entirety, and are called single-sided and double-sided selection methods. In the single-sided method, when a column is selected, only a single memory area would be selected in one operation, for example memory area 602 under CG[1] 802. In the double-sided selection method, when a column is selected, both memory areas under the same CG line would be selected at the same time in a single operation, for example memory area 602 and memory area 603 under CG[1] 802.

The advantage of the double-sided selection method is that more cells can be selected in parallel for higher program and read bandwidth. However, the decode area is more complicated, because the two bit line columns BL[0] 401 and BL[2] 403 on opposite sides of the selected column BL[1] 402 will need to be selected and connected to two sense amplifiers or page buffers during read and program. In the case that the column selection is 8, for double-sided select, we say choose 2 bits in 8 columns, and for single-sided select, we say choose 1 bit in 8 columns.

U.S. Pat. Nos. 6,707,720 and 6,707,742 to Kamei et al and 6,710,399 to Kamei are directed towards a Twin MONOS memory cell array organization for NOR type applications. The memory organization is shown in FIG. 5. This memory array is arranged in the diffusion bit array type with CG and BL's running in parallel and orthogonal to the WL, and sectors are defined to be vertical and narrow, because the data width is only on the order of 16b. The column decode is fixed to one in 4 columns in order to minimize width of each sector. The array organization has bit line select transistors and CG lines are connected horizontally. To reduce bit line and control gate line resistance, both are stitched to metal at regular intervals. The target RC delay is less than 10 microseconds. With this arrangement, the number of cells that can be programmed in parallel in a single erase block is only K, the number of I/O. In this arrangement, all of the columns in a sector are selected together to form an erase block. This organization does not take advantage of the inherent ability of the Twin MONOS cell to select individual cells on a single word line during erase.

SUMMARY OF THE INVENTION

It is an objective of the present invention to provide basic organization methods for small area memory arrays wherein wide program data width and power savings can be realized.

It is another objective of the current invention to provide further reduction of erase block size by sub-dividing the control gate lines and applying a gate bias to the unselected CG lines during erase.

In accordance with the objects of the invention, a non-volatile semiconductor storage device is achieved. The device comprises a memory cell array region in which a plurality of C columns and R rows of memory cells comprise one UNIT, arranged in a "diffusion bit" array organization which is comprised of R rows of word lines running in a first direction, and C columns of diffusion sub bit lines running in a second direction, and C columns of sub control gate lines running in the same second direction and a sense amplifier/page buffer area shared by several UNIT's through a bit decode circuit, wherein the diffusion sub bit lines in each of the UNIT's are connected to main bit lines which are in turn connected to the sense amplifier/page buffer area, wherein the bit decode circuit selects one diffusion sub bit line column of memory cells in every E columns.

The organizations below will be explained using the Twin MONOS device as a base, but it will be understood by those skilled in the art that the organizations of the invention can be applied to any device with similar operation, disturb and selection characteristics without departing from the spirit and scope of the invention.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
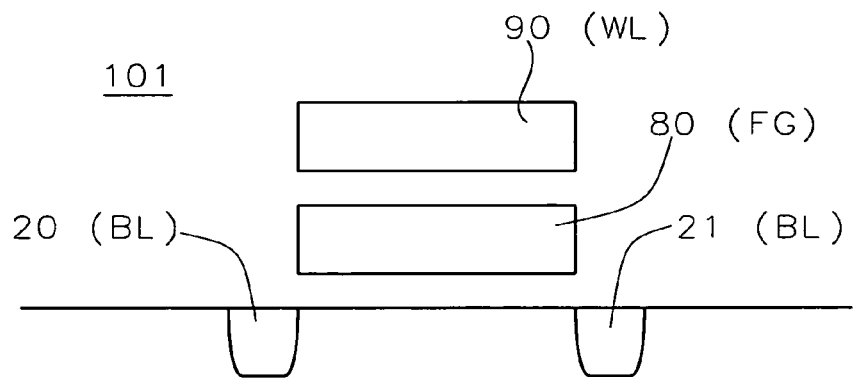
FIG. 1 is a cross-sectional representation of a Prior Art NAND cell.
Figure 2:
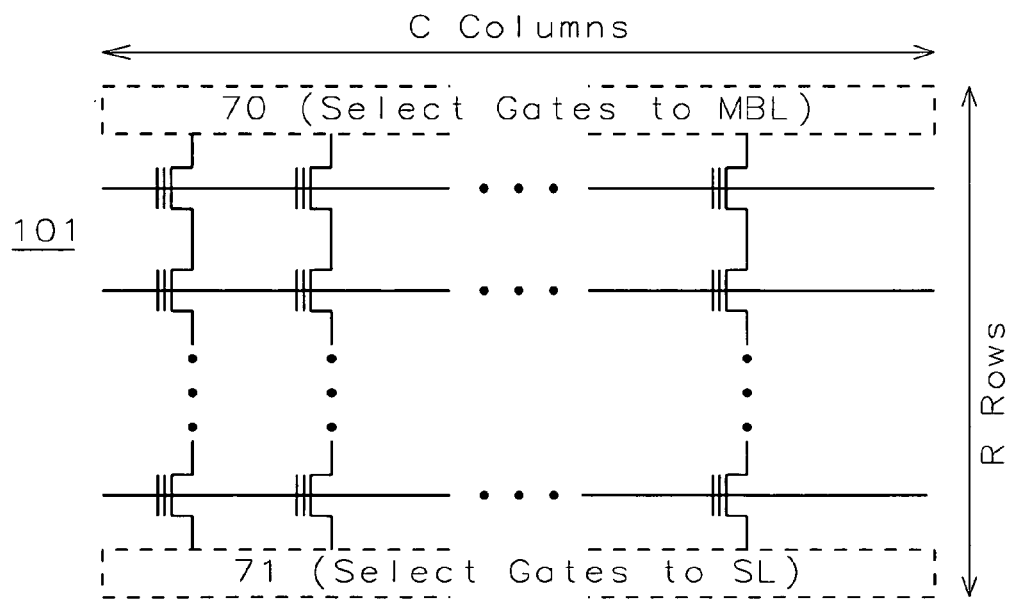
FIG. 2 is a schematic representation of a cell array of the Prior Art NAND cell in FIG. 1.
Figure 3:
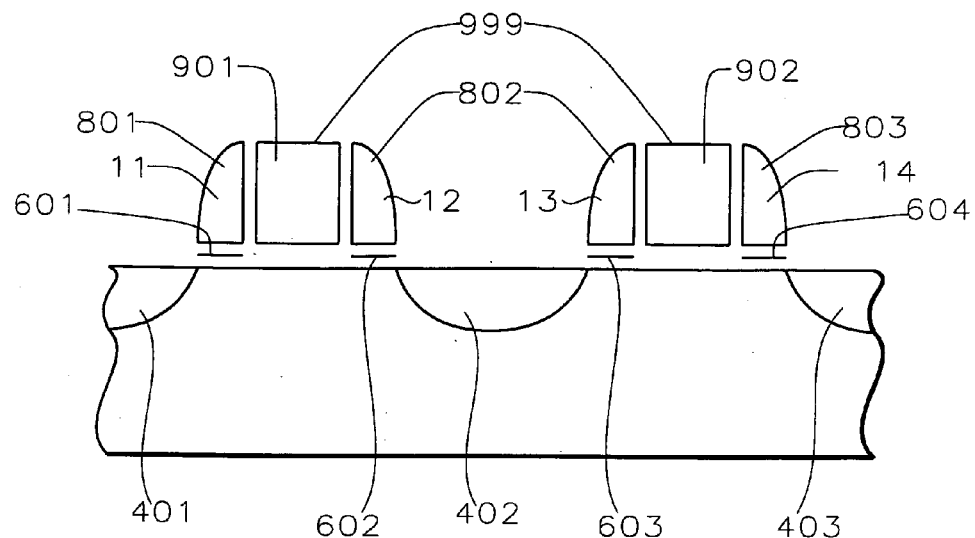
FIG. 3 is a cross-sectional representation of a Twin MONOS cell.
Figure 4:
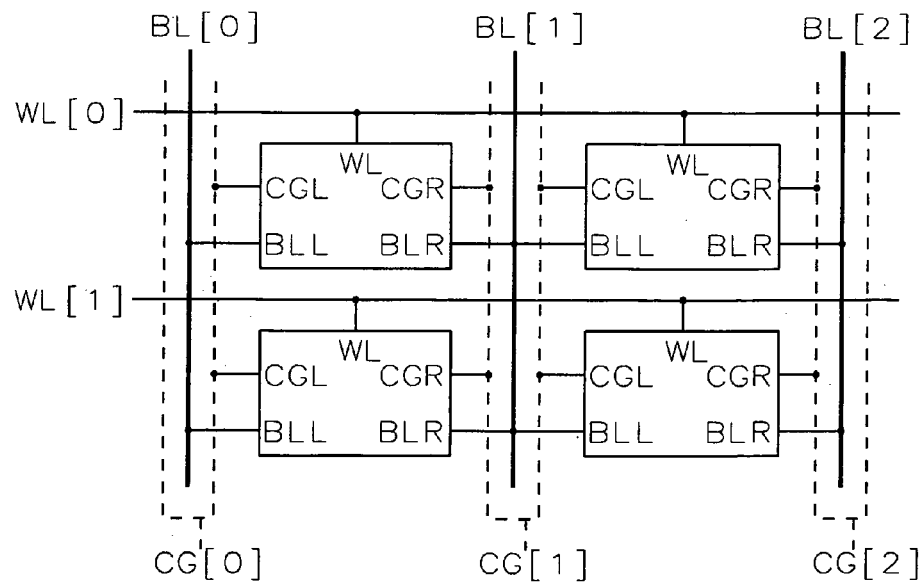
FIG. 4 is a schematic representation of the Twin MONOS cell of FIG. 3 in a diffusion bit type array.
Figure 5:
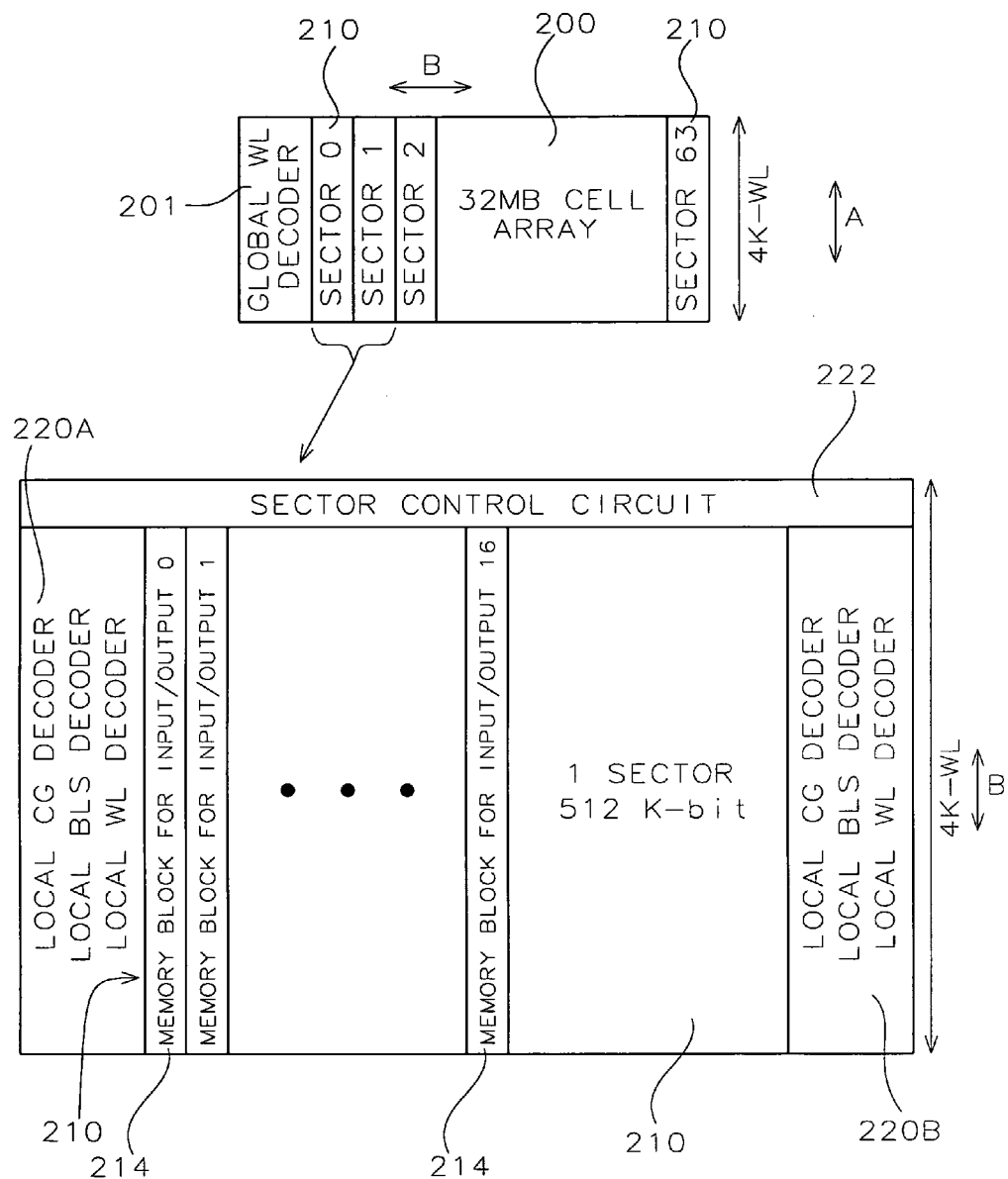
FIG. 5 is a block diagram of an array organization for a Prior Art Twin MONOS implementation for a NOR type application.
Figure 6:
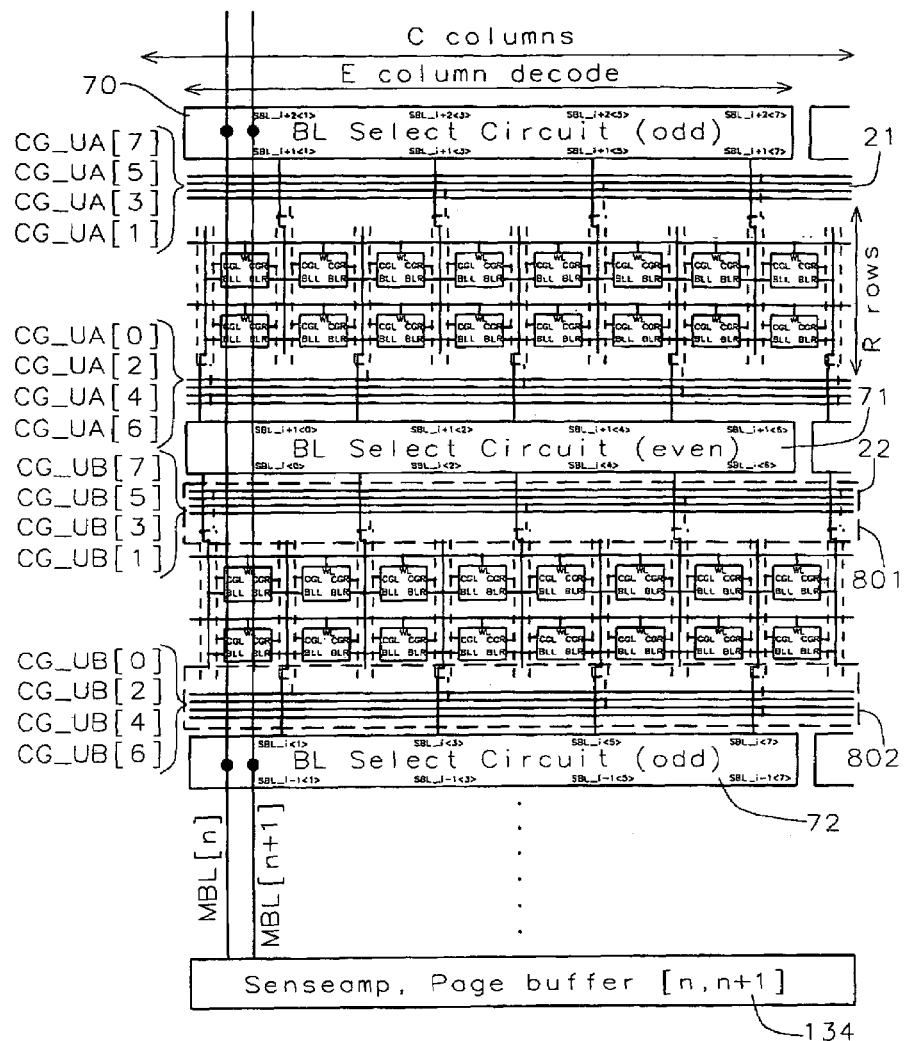
FIG. 6 is a block diagram of an array organization according to the first embodiment of the present invention.

Array organization for Twin MONOS memory cells. In the first embodiment of this invention, a new array organization is proposed. Unlike the array types described in the preceding Background section, cells that share the same word line do not necessarily share the same erase block. A schematic and block representation is given in FIG. 6. Twin MONOS cells are arranged in the diffusion bit array, with poly WL's running in a horizontal direction and diffusion BL's and poly CG's both running orthogonal to the WL's in a vertical direction.

In this figure, several memory units are shown which share a common sense amplifier/page buffer. Each UNIT's selected sub bit lines (SBL's) are connected via the UNIT's BL selection circuit to a global main bit line (MBL) which is connected to the sense amplifier/page buffer.

Two memory UNITS are shown in detail, UNIT A 21 and UNIT B 22. The number of rows in a single UNIT is R and the number of columns is C.

It is also possible to reduce the RC delay of the poly WL by stitching the WL poly to metal at intervals. If so, end columns may be needed to cap off the memory array. Therefore, the number of columns may not be exactly C; it is more likely to be C+the number of stitches, or may even be C+2×the number of stitches, depending on whether one extra column is needed to cap off one side, or two extra columns are needed to cap off both sides. For simplicity of explanation, from this point on, we will assume that C columns is approximately C, not exactly C.

In order to reduce BL capacitance and/or resistance, the diffusion BL's may be segmented by sub-decode transistors in the BL decode areas 70, 71, and 72. The BL selection can be flexible. In this example, the column decode is one in 8 (E=8), but any other multiple is also practical, such as 4, 16, 32, etc. A selected column includes one bit line and one control gate.

Depending on the layout constraints with metal pitch and contact and via spacing, as well as the fabrication process design, different layouts for the stitch area are possible. Variations can include permutations of (i) BL and CG contacts in-line vs. out-of-phase, and (ii) BL and CG order switching, i.e., which type of contact is closer to the memory array.

Figure 7:
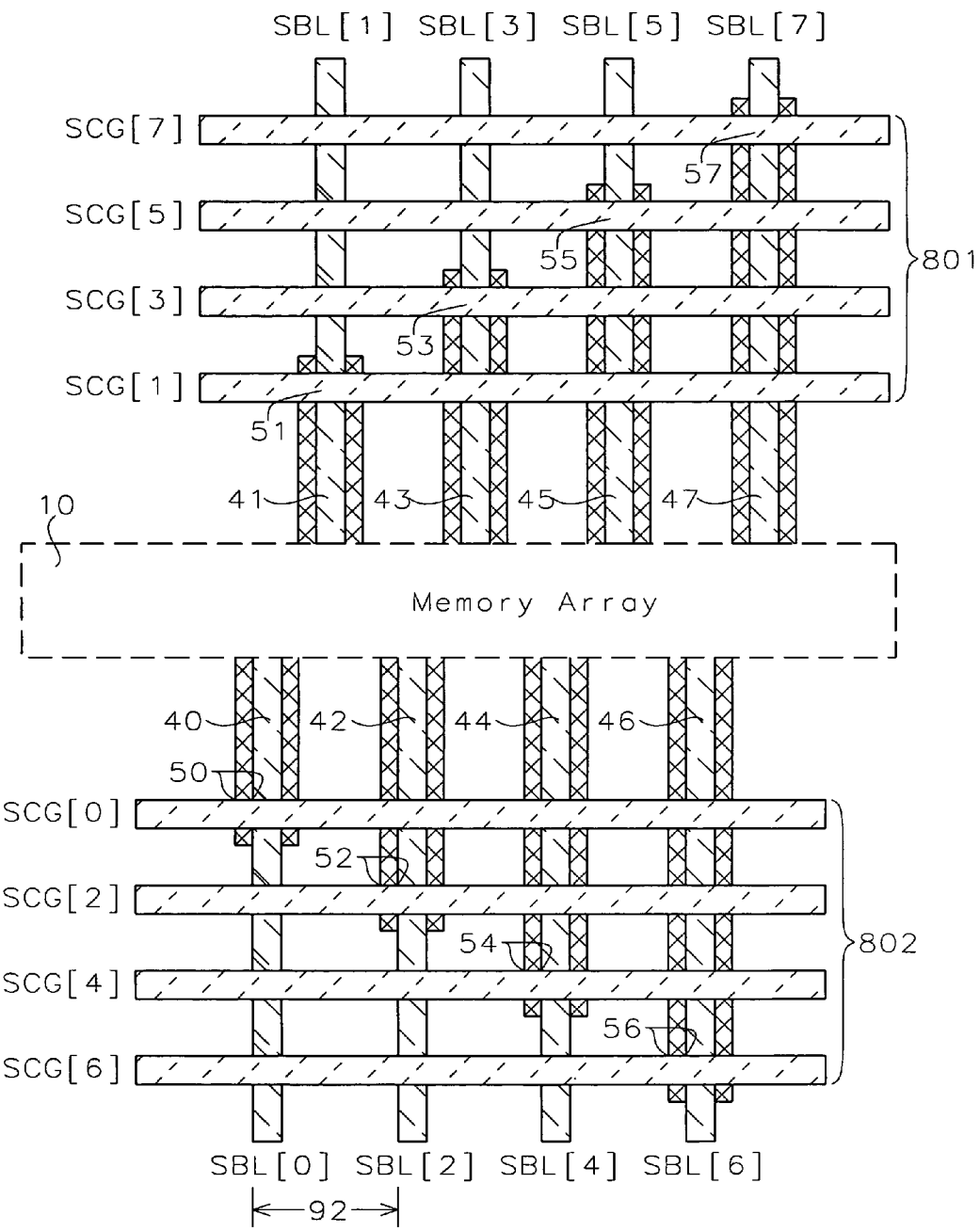
FIG. 7 is a layout example of the CG and BL contact area according to the first embodiment of the present invention.

Stitch area: One example of a stitch area layout is given in FIG. 7. This layout is an example of BL contacts 40–47 in line with CG contacts 50–57, so that the even BL contacts 40,42,44,46 are taken on the same side of the memory array 10 as the even CG contacts 50,52,54,56, and the odd BL contacts 41,43,45,47 and CG contacts 51,53,55,57 are taken on the other side of the memory array. BL contacts 40–47 are closer to the memory array edge than the CG contacts 50–57. The density advantage of this layout is that two cells can be fit within a single metal pitch 92. If a wider cell pitch is used, of course the layout constraints are relaxed and greater freedom in choosing the metal levels for BL and CG can be allowed.

However, referring to the stitch layout that uses the minimum metal pitch cell described above, since both BL and CG contacts are in-line, the vertical BL metals SBL [0–7] should be a higher level metal than the horizontal CG metals SCG[0–7]. In this example, SBL[0–7] can be Metal 2 and SCG[0–7] can be Metal 1. The BL contacts 40–47 will need an additional via stack in order to connect between the diffusions to Metal 2.

Figure 8:
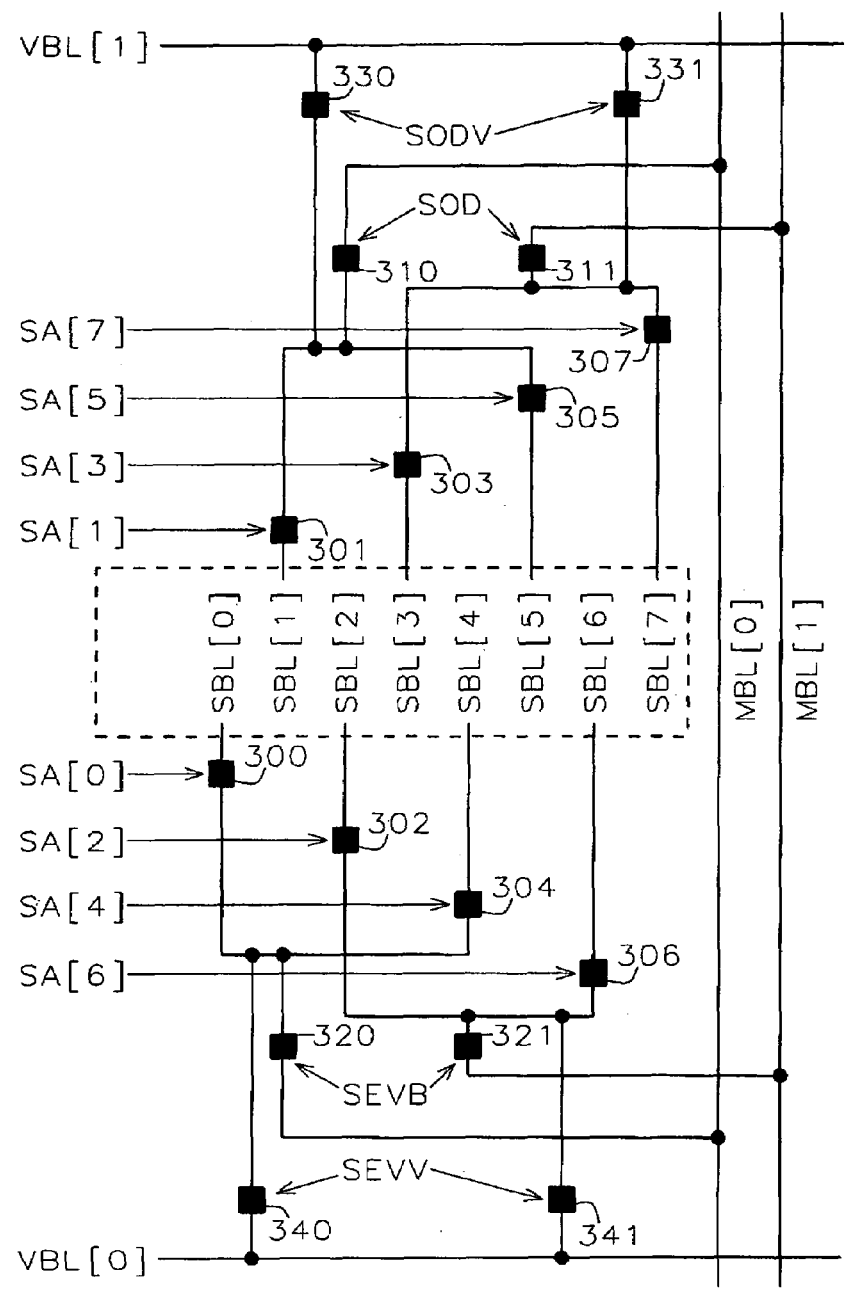
FIG. 8 is a circuit diagram example of the BL selection circuit area according to the first embodiment of the present invention.

BL select circuit: An example of a BL select circuit, or bit line decode circuit, is given in FIG. 8. This select circuit example uses a double-sided selection method, in which the 2 bits out of every 8 columns are selected. Two Main Bit lines (MBL) are needed for every 8 Sub Bit Lines (SBL). For large memory densities, a hierarchical bit line organization is preferred so that a single sense amplifier can be shared between multiple UNIT's. Bit line capacitance and IR drop can also be reduced. The two columns on both sides of the selected column will be connected to the two MBL's for sensing during read and to program or program inhibit during the write operation.

Furthermore, during program and verify switching, it is preferable to minimize the capacitance of the high voltage switching, especially when the number of cells being programmed is large. In this circuit, the selected column provides the source voltage to the memory cell during read and the drain voltage during program. The selected column does not need to be connected to the sense amplifier/page buffer. Therefore it makes sense that this selected voltage would be provided horizontally in the sub-decode transistor. The metal capacitance of the horizontal supply voltage will be much lower than if the selected voltage were to be provided through an additional set of MBL's.

Figure 9:
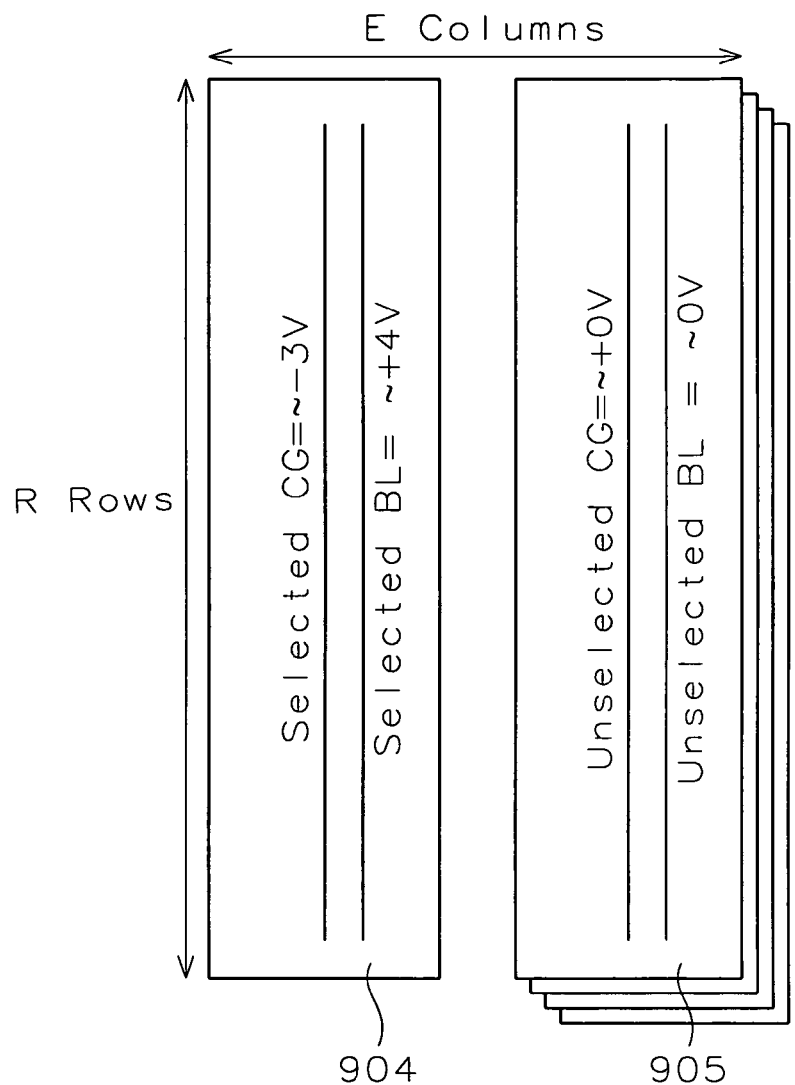
FIG. 9 is a block diagram of E columns of memory cells in a single UNIT according to the first embodiment of the present invention.

Several erase blocks in a single UNIT: FIG. 9 shows a block diagram of E columns and R rows of memory cells. During erase, there is one selected column and E-1 unselected columns. Erase voltage is applied to the selected column: approximately 4V to the selected BL and approximately 3V to the selected CG. The unselected columns' BL's and CG's can be biased and floating at 0V. WL disturb is minimal during erase. Even if the selected WL's are −1V, there is no danger of erase of the unselected cells.

Thus, referring back to FIG. 6, the maximum number of erase blocks in a single UNIT is equal to the column decode, E. If E=8, up to 8 erase blocks in the UNIT are possible.

Figure 10:
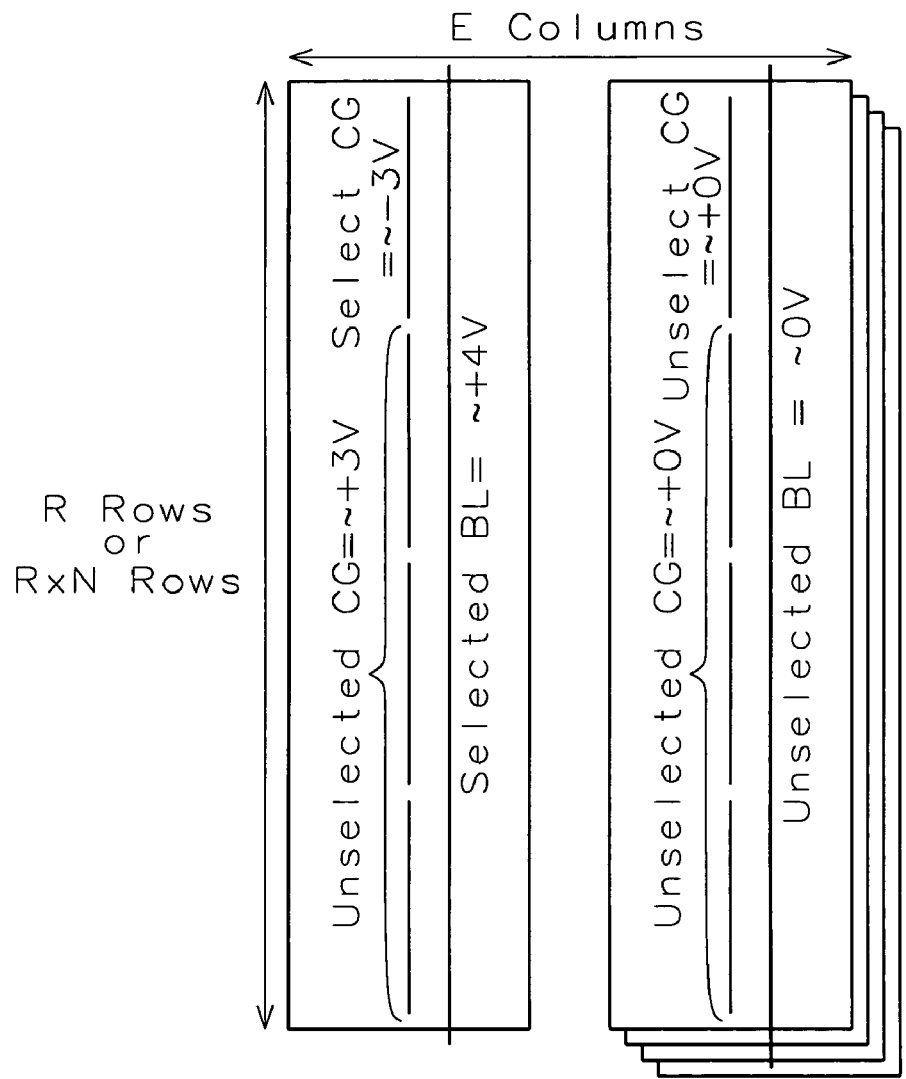
FIG. 10 is a block diagram of E columns of memory cells in a single UNIT with further CG segmentation according to the first embodiment of the present invention.
Figure 11:
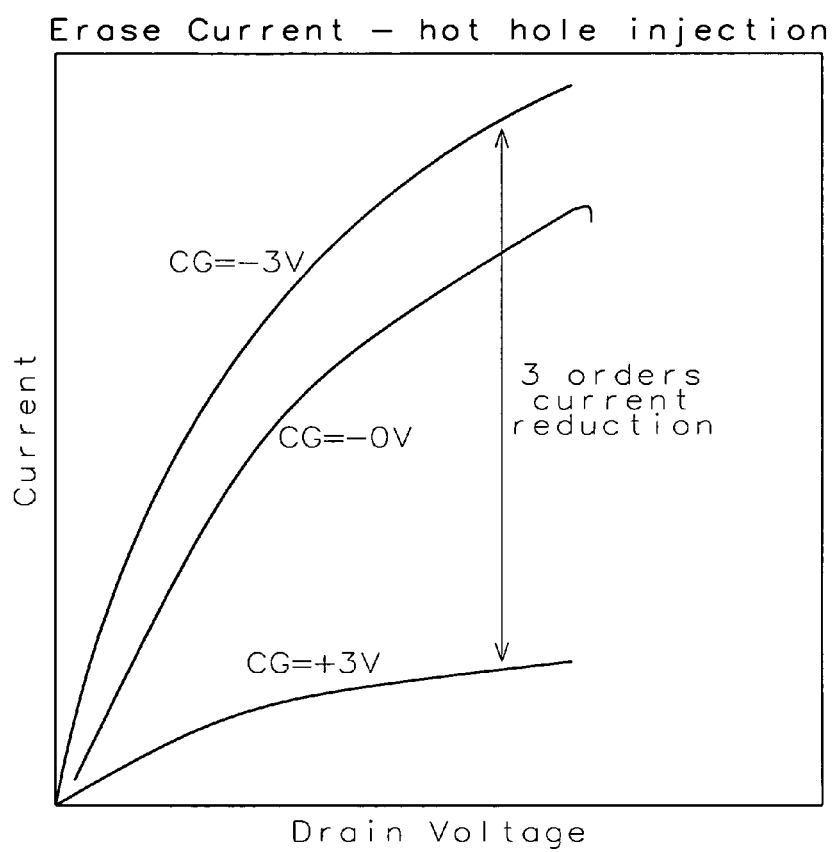
FIG. 11 is a graphical representation of the hot hole erase current as a function of BL Drain voltage and CG voltages according to the first embodiment of the present invention.

In addition, by sub-dividing the CG lines only, it is possible to reduce the erase block size further, while still maintaining reasonable area efficiency. The area penalty for additional stitch contacts is low compared to cutting the CG and BL's by select transistors. FIG. 10 shows an example block diagram in which the CG is sub-divided into 4. The sub BL runs electrically continuously through the UNIT's column. The number of rows may be R or greater than R. Here, when the selected BL is approximately 4V, the unselected CG in the selected column is biased to a positive voltage of approximately 3V. According to the plot of disturb characteristics shown in FIG. 11, there is a three order difference in magnitude between CG erase voltage −3V and CG inhibit erase voltage 3V.

Figure 12:
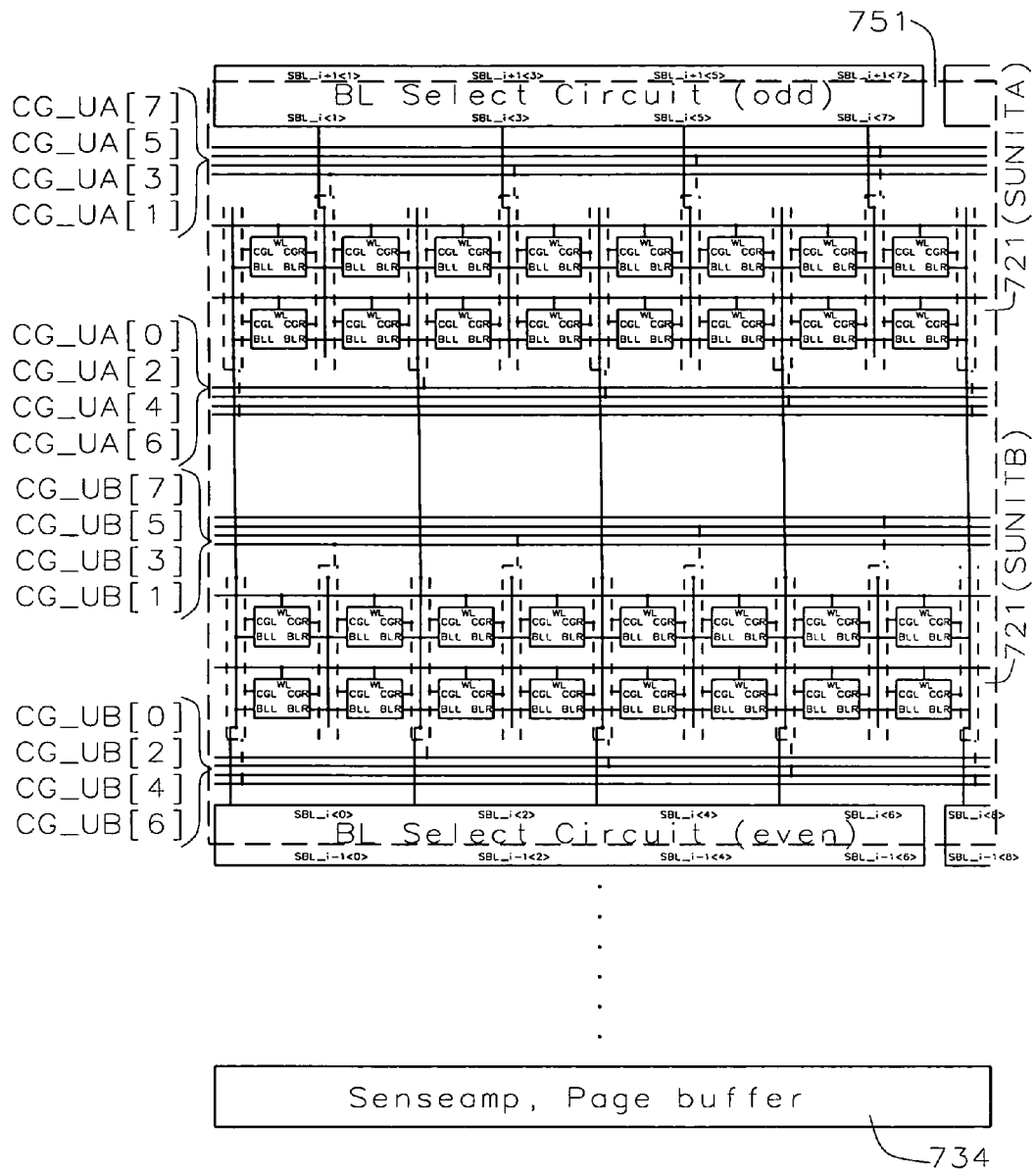
FIG. 12 is a block diagram of an array organization according to a second embodiment of the present invention.

FIG. 12 gives a schematic in which the UNIT's (UNIT[0] 751) are divided into 2 Sub Units (721 SUNITS A & B). During read, program and erase, power can be saved by applying voltages only to the selected SUNIT lines. Also in this example, the smallest Erase block size would be 2×Number of Rows R×Number of Columns C/Column Decode E/Number of Sub-units (in this case 2).

An additional advantage of the smaller erase block size is that IR drop along the diffusion sub bit lines can be reduced during erase. Therefore the erase current requirement will be reduced and erase distribution will be improved.

Also, it has been found that several erase pulses is more effective than a single long erase pulse. For example, a single 400 ms pulse will only shift VT down 0.4V, but 4 100 ms pulses will shift the VT down by 1.0V.

Depending on the metal pitch layout constraints, this method of CG segmentation may require an extra metal for the SBL. In the first array organization embodiment, the diffusion SBL is connected to the metal MBL in the sub-decode circuit. But in the second embodiment method, the diffusion SBL's may need to be connected to a metal SBL in the BL and CG stitch area. Then the metal SBL will be connected to the metal MBL in the sub-decode circuit.

As an alternative, the SBL and MBL may share the same metal layer by widening the cell pitch slightly.

Figure 13:
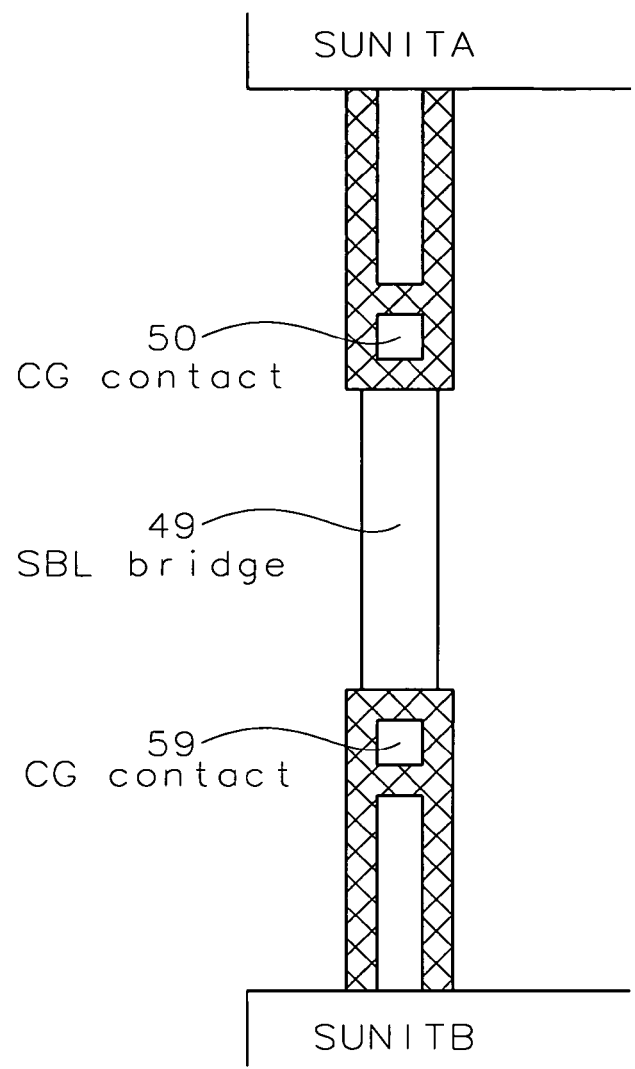
FIG. 13 is a layout example of the CG and BL contact area according to the second embodiment of the present invention.

Another alternative is shown in FIG. 13. The diffusion SBL of one segment could be connected through to the diffusion of the neighboring segment by either changing the order of CG and BL contacts (place the CG contacts closer to the memory array edge than the BL contact), or by creating a pass-through diffusion bridge 49.

While the invention has been particularly shown and described with reference to preferred embodiments thereof, it will be understood by those skilled in the art that various changes in form and details may be made without departing from the spirit and scope of the invention.

What is claimed is:

1. A non-volatile semiconductor storage device comprising:
   a memory cell array region in which a plurality of C columns and R rows of memory cells comprise one UNIT, arranged in a "diffusion bit" array organization which is comprised of R rows of word lines running in a first direction, and C columns of diffusion sub bit lines running in a second direction, and C columns of sub control gate lines running in the same second direction; and
   a sense amplifier/page buffer area shared by several UNIT's through a bit decode circuit, wherein said diffusion sub bit lines in each of said UNIT's are connected to main bit lines which are in turn connected to said sense amplifier/page buffer area, wherein said bit decode circuit selects one column of memory cells in every E columns wherein said one column comprises a diffusion sub bit line and a sub control gate line.

2. The non-volatile storage device as defined in claim 1, wherein the number of Erase blocks in a single UNIT can be E or lower.

3. The non-volatile storage device as defined in claim 1 wherein said sub control gate lines comprise polysilicon.

4. The non-volatile storage device as defined in claim 1, wherein said 1 in E second direction sub control gate lines are connected together by a conductive line running in said first direction.

5. The non-volatile storage device as defined in claim 4, wherein the number of first direction conductive sub control gate lines is E.

6. The non-volatile storage device as defined in claim 1, wherein a UNIT can be further divided into N SUNIT's by segmenting the sub control gate lines.

7. The non-volatile storage device as defined in claim 6, wherein said 1 in E second direction sub control gate lines are connected together by a conductive line running in said first direction.

8. The non-volatile storage device as defined in claim 7, wherein the number of first direction conductive sub control gate lines is E×N.

9. The non-volatile storage device as defined in claim 6 wherein the smallest erase block size is 2×R×C/E/N.

10. The non-volatile storage device as defined in claim 6 wherein a diffusion sub bit line of a first of said SUNIT's is connected to a diffusion sub bit line of a second of said SUNIT's by a diffusion bridge between a control gate contact of said first SUNIT and a control gate contact of said second SUNIT.

11. The non-volatile storage device as defined in claim 1 further comprising sub-decode circuits in said bit decode circuits wherein diffusion bit lines are segmented into said diffusion sub bit lines by said sub-decode circuits.

12. The non-volatile storage device as defined in claim 11 wherein said diffusion sub bit lines are connected to metal said main bit lines in said sub-decode circuits.

13. The non-volatile storage device as defined in claim 11 further comprising stitching polysilicon bit lines and control gates to metal at intervals.

14. The non-volatile storage device as defined in claim 1 wherein even bit line contacts are taken on a same side of said memory cell array as even control gate contacts and wherein odd said bit line contacts and odd said control gate contacts are taken on the other side of said memory cell array.

15. The non-volatile storage device as defined in claim 14 wherein bit line contacts are closer to an edge of said memory cell array than are control gate contacts.

16. The non-volatile storage device as defined in claim 14 wherein control gate contacts are closer to an edge of said memory cell array than are bit line contacts.

17. A non-volatile semiconductor storage device comprising:
a memory cell array region in which a plurality of C columns and R rows of memory cells comprise one UNIT, arranged in a "diffusion bit" array organization which is comprised of R rows of word lines running in a first direction, and C columns of diffusion sub bit lines running in a second direction, and C columns of sub control gate lines running in the same second direction;
a bit decode circuit for each UNIT;
sub-decode circuits in each of said bit decode circuits wherein diffusion bit lines are segmented into said diffusion sub bit lines by said sub-decode circuits; and
a sense amplifier/page buffer area shared by several UNIT's through said bit decode circuits, wherein said diffusion sub bit lines in each of said UNIT's are connected to main bit lines which are in turn connected to said sense amplifier/page buffer area, wherein said bit decode circuit selects one column of memory cells in every E columns wherein said one column comprises a diffusion sub bit line and a sub control gate line.

18. The non-volatile storage device as defined in claim 17 wherein erase voltage is applied to the selected said diffusion sub bit line and said sub control gate line of said selected column.

19. The non-volatile storage device as defined in claim 17, wherein the number of Erase blocks in a single UNIT can be E or lower.

20. The non-volatile storage device as defined in claim 17, wherein a UNIT can be further divided into N SUNITs, by segmenting said sub control gate lines.

* * * * *